United States Patent
Fischer et al.

(10) Patent No.: US 8,062,982 B2
(45) Date of Patent: Nov. 22, 2011

(54) HIGH YIELD PLASMA ETCH PROCESS FOR INTERLAYER DIELECTRICS

(75) Inventors: Daniel Fischer, Dresden (DE); Matthias Schaller, Boxdorf (DE); Matthias Lehr, Dresden (DE); Kornelia Dittmar, Dresden (DE)

(73) Assignee: Advanced Micro Devices, Inc, Austin, TX (US)

( * ) Notice: Subject to any disclaimer, the term of this patent is extended or adjusted under 35 U.S.C. 154(b) by 870 days.

(21) Appl. No.: 11/867,972

(22) Filed: Oct. 5, 2007

(65) Prior Publication Data

US 2008/0202685 A1    Aug. 28, 2008

(30) Foreign Application Priority Data

Feb. 28, 2007   (DE) .................. 10 2007 009 913

(51) Int. Cl.
  *H01L 21/302*   (2006.01)
(52) U.S. Cl. ......... 438/743; 438/714; 438/740; 438/744
(58) Field of Classification Search .................. 438/706, 438/710, 712, 714, 715, 723, 740, 743, 744
  See application file for complete search history.

(56) References Cited

U.S. PATENT DOCUMENTS

| | | | |
|---|---|---|---|
| 6,080,662 A | 6/2000 | Chen et al. | 438/637 |
| 6,428,716 B1 * | 8/2002 | Demmin et al. | 216/83 |
| 7,115,517 B2 * | 10/2006 | Ye et al. | 438/700 |
| 2002/0182880 A1 * | 12/2002 | Zhu et al. | 438/724 |
| 2004/0106300 A1 | 6/2004 | Young | 438/763 |
| 2005/0233572 A1 * | 10/2005 | Su et al. | 438/618 |
| 2006/0068592 A1 * | 3/2006 | Dostalik | 438/706 |
| 2006/0183346 A1 * | 8/2006 | Liu | 438/778 |

FOREIGN PATENT DOCUMENTS

| | | |
|---|---|---|
| EP | 1 367 638 A1 | 12/2003 |
| JP | 2004 172456 A | 6/2004 |
| KR | 20040067817 | 7/2004 |

OTHER PUBLICATIONS

Thomson-Derwent Abstract from WPI-Online, found in STN, acc#2006-498273[51] KR20050067817 A.
German Office Communication dated Oct. 19, 2007.

\* cited by examiner

*Primary Examiner* — Lan Vinh
(74) *Attorney, Agent, or Firm* — Williams, Morgan & Amerson

(57) ABSTRACT

A high yield plasma etch process for an interlayer dielectric layer of a semiconductor device is provided, according to an embodiment of which a dielectric layer is etched with a nitrogen-containing plasma. In this way, the formation of polymers on a backside bevel of a substrate is avoided or substantially reduced. Remaining polymer at the backside bevel can be removed in situ by post-etch treatment. Further, a plasma etching device is provided comprising a chamber, a substrate receiving space for receiving a substrate, a plasma generator for generating a plasma in the chamber and a temperature conditioner for conditioning a temperature at an outer circumferential region of the substrate receiving space and thereby minimizing temperature gradients at a bevel of the wafer.

15 Claims, 8 Drawing Sheets

| process step | flow rate CF4 (sccm) | flow rate CHF3 (sccm) | flow rate C4F8 (sccm) | flow rate O2 (sccm) | flow rate N2 (sccm) | flow rate NH3 (sccm) | flow rate Ar (sccm) | Bias power (W) | Source power (W) | pressure (mTorr) | time (s) |
|---|---|---|---|---|---|---|---|---|---|---|---|
| break through | 20 | 20 | | | | | | 800 | 200 | 100 | 36 |
| main etch | | | 15 | 5 | 50 | | 600 | 1000 | 500 | 15 | 110 |
| resist ashing | | | | 1000 | | | | 200 | 1500 | 300 | 80 |
| etch Stop layer etch | 30 | | | 10 | 90 | | | 150 | 0 | 30 | 40 |
| post-etch treatment | | | | 150 | | 75 | | 200 | 1500 | 30 | 30 |

FIG.5

HIGH YIELD PLASMA ETCH PROCESS FOR INTERLAYER DIELECTRICS

BACKGROUND OF THE INVENTION

1. Field of the Invention

Generally, the present disclosure relates to the field of plasma etching, and, more particularly, to plasma etching of an interlayer dielectric during semiconductor device manufacturing.

2. Description of the Related Art

The fabrication of complex integrated circuits requires the provision of a large number of transistor elements, which are used in logic circuits as efficient switches and which represent the dominant circuit element for designing circuits. Generally, a plurality of process technologies are currently practiced, wherein, for complex circuitry, such as micro-processors, storage chips and the like, CMOS technology is currently the most promising approach due to the superior characteristics in view of operating speed and/or power consumption and/or cost efficiency. In CMOS circuits, complementary transistors, i.e., P-channel transistors and N-channel transistors, are used for forming circuit elements, such as inverters and other logic gates to design highly complex circuit assemblies, such as CPUs, storage chips and the like. During the fabrication of complex integrated circuits using CMOS technology, millions of transistors, i.e., N-channel transistors and P-channel transistors, are formed on a substrate including a crystalline semiconductor layer. After completing the formation of the active components, e.g., transistors, capacitors or resistors, the wafer is usually sealed with a layer of a dielectric material, e.g., silicon dioxide ($SiO_2$). Via holes are formed in the dielectric material which are filled with a suitable metal, e.g., tungsten and tantalum, thereby forming metal plugs which provide electrical connections to the contacts of the individual components. The process sequence up to this point is sometimes called "Front End of Line" (FEL) process sequence. Thereafter, the components are usually tested to ensure correct operation of the components.

The individual components, e.g., transistors, require electrical interconnections which provide the final functionality of the desired units, e.g., chips, which include the individual components. The process sequence for formation of the electrical interconnections between the components is sometimes called "Back End of Line" (BEOL) process sequence. Usually, the electrical interconnections are formed by a series of conductive layers which are separated by dielectric layers. The dielectric layers are often referred to as "InterLayer Dielectric" (ILD).

Common materials for interlayer dielectric layers comprise silicon-based oxide materials that serve as electrical insulators, e.g., undoped silicon oxide, fluorine-doped silicon oxide and other materials. Other interlayer dielectric materials include low-k dielectrics, i.e., insulating materials with a low dielectric constant, e.g., materials with a k-value less than 3. Low-k dielectrics include silicon-based materials as well as carbon-based materials, polymer materials and the like.

The increasing level of integration of integrated circuits has also resulted in an increase in the number of layers that make up the integrated circuit. Up to ten interconnection layers or more may be provided. However, as the number of layers in the integrated circuit continues to increase, advanced processes are being developed in order to reduce the number of process steps which are necessary for one functional layer. These advanced processes often demand extraordinary properties of the chemistry of the etching process. Etching stacked dielectric layers is one of the most difficult demands.

The individual interconnection layers are electrically connected by conductive plugs, as described above, which are formed in respective via holes in the dielectric layers. Different methods for providing the electrical interconnections are commonly used. One method is to fill not only the via holes but to provide a continuous metal layer of the respective metal over both the filled via holes and the dielectric. Thereafter, a lithographic step is used to define a photoresist layer over the planar metal layer and respectively etch the exposed metal. In this way, a network of electrical interconnects is obtained. Another method, called damascene process, uses chemical mechanical polishing instead of metal etching. This is particularly advantageous for copper interconnects, since the etch products obtained by copper etching are less volatile than respective etch products obtained by silicon or aluminum etching. In the damascene process, in addition to the via holes, recesses for the electrical interconnections are formed in the dielectric layer. The via holes as well as the recesses corresponding to the electrical interconnections are filled with the desired metal and afterwards the surface is planarized by chemical mechanical polishing (CMP).

In order to obtain a desired high packing density, a small diameter of the via holes is desirable. However, since the thickness of the dielectric layer must be reasonably thick to minimize the ILD capacitance, the via holes in modern integrated circuits are formed exhibiting an aspect ratio that may be as high as approximately 8:1 or more, and the opening may have a diameter of 0.1 μm or smaller. The aspect ratio of such openings is generally defined as the ratio of the depth of the opening to the width of the opening. Such high aspect ratios require a reliable etch process with high accuracy.

The via holes are usually formed by a highly anisotropic etch process, e.g., a plasma etch process. Generally, a plasma etch process comprises providing process gases which form, at a suitable process temperature, gaseous compounds with the material to be etched. Usually the process gases do not react spontaneously with the material to be etched. Rather, a plasma is provided in which the process gases dissociate into reactive free radicals which do react spontaneously to form volatile compounds. For a dielectric etch, in particular for a silicon dioxide ($SiO_2$) etch, plasma etch processes on the basis of carbon-fluorine-process gases, referred to as fluorocarbon in the following, are well established. Plasma sources of various kinds are known, including capacitively coupled plasma etchers. Herein, at least two electrodes are provided in a chamber with the wafer to be etched therebetween. To one electrode, e.g., to a lower electrode, an alternating current power, typically a radio frequency (RF) power, is applied for generating and maintaining a plasma in the chamber. Further, a bias power is applied over the electrodes, leading to a directional bombardment of the wafer with the ions generated from the precursor gases. Another type of plasma etcher is a inductively coupled plasma etcher, wherein the plasma in the chamber is generated by generating an alternating electromagnetic field in the chamber by applying a respective current to a coil.

In order to obtain a well-defined etch result, etch stop layers are usually provided below the dielectric layer which is subjected to plasma etching. The etch stop layer has a composition relative to the dielectric layer such that an etch chemistry is available which effectively etches a vertical hole in the overlying dielectric layer but stops on the etch stop layer. In other words, the etch process selectively etches the dielectric layer over the etch stop layer. Advanced semiconductor devices comprise a dielectric layer of, e.g., undoped silicon oxide, non-stoichiometric materials $SiO_x$, doped silica glasses such as fluorinated silica glass (FSG), e.g., F-TEOS, which exhibits much the same chemistry as silicon dioxide ($SiO_2$), low-k dielectrics and the like. A suitable stop layer material for oxides like silicon dioxide ($SiO_2$) is silicon nitride, e.g., $Si_3N_4$ or non-stoichiometric ratios $SiN_x$ with x between 1.0 and 1.5, may be suitable.

In the plasma etch process, besides the volatile compound formed of the material to be etched and the respective precursor, polymers may form from the process gases, e.g., CxFy fragments may form fluorocarbon polymers. The well-defined formation of polymers may be used to advantage to optimize the etch process. However, even undesired side reactions may lead to the formation of polymers in the etched via hole which may interfere with a conductive material subsequently filled in the via hole. After the etching of via holes is completed, the resist mask must be removed, which may constitute an additional source of residual polymer material left within the etched via. It is common practice in plasma etching via holes to include a post-etch treatment (PET) step to minimize the residual polymer material left within the via hole.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a technique for etching an interlayer dielectric that may increase the yield of semiconductor devices by modifying the dielectric etch process so as to substantially avoid or reduce the formation of polymers at a backside bevel of a wafer or by modifying the dielectric etch process so as to modify the polymer deposited on the backside bevel of the wafer such that it can be stripped in situ.

One illustrative method of patterning a dielectric layer of a semiconductor device disclosed herein comprises providing a semiconductor device having a metallization layer and a dielectric layer adjacent the metallization layer, providing a mask layer on the dielectric layer, the mask layer defining unmasked regions of the dielectric layer, providing a plasma on the basis of a dielectric etching process gas, wherein the dielectric etching process gas includes nitrogen ($N_2$), and etching the dielectric layer with the plasma in the unmasked regions, thereby patterning the dielectric layer.

Another illustrative method disclosed herein comprises providing a plasma chamber, providing a semiconductor device in the plasma chamber, the semiconductor device having a metallization layer and a dielectric layer adjacent the metallization layer, etching the dielectric layer with a plasma on the basis of a dielectric etching process gas, wherein the dielectric etching process gas includes nitrogen ($N_2$), and wherein the nitrogen ($N_2$) is provided in the plasma chamber at a flow rate between approximately 40-60 sccm.

One illustrative plasma etching device disclosed herein comprises a chamber, a substrate receiving space for receiving a substrate, a plasma generator for generating a plasma in a plasma region of the chamber for etching a frontside of a substrate received in the substrate receiving space with the plasma, a temperature conditioner for individually conditioning a temperature of a backside circumferential region of a substrate received in the substrate receiving space, wherein the backside of the substrate received in the substrate receiving space is opposite the frontside of the substrate.

BRIEF DESCRIPTION OF THE DRAWINGS

The disclosure may be understood by reference to the following description taken in conjunction with the accompanying drawings, in which like reference numerals identify like elements, and in which:

FIG. 5 schematically illustrates, in part, a cross-sectional view of a wafer after an etching process according to an embodiment of the invention;

Figure 1A:
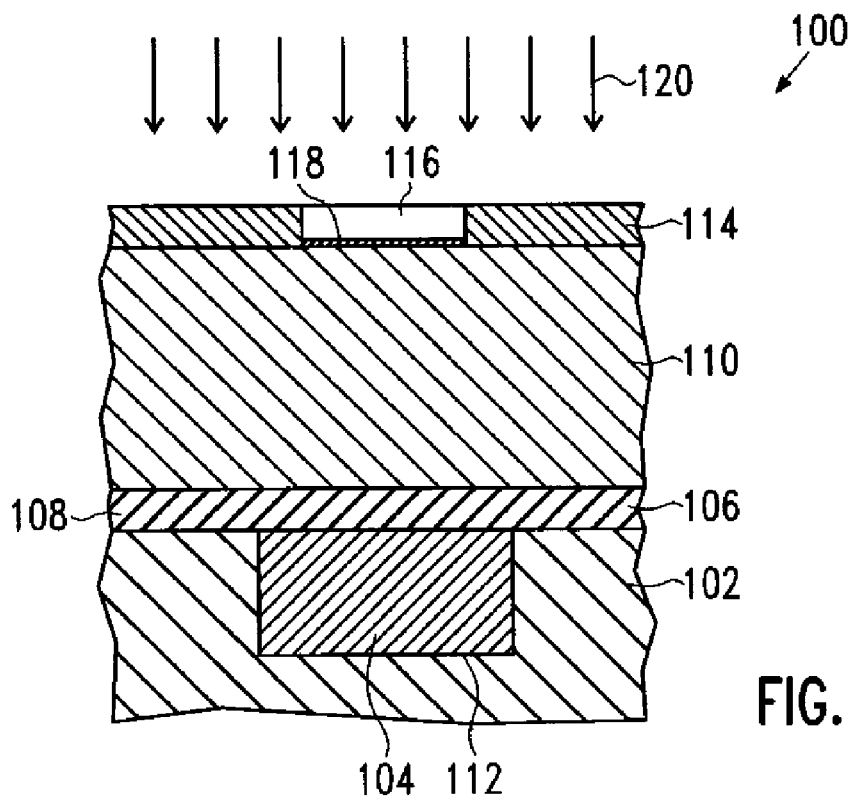
FIGS. 1A-1F schematically illustrate a layer stack comprising an interlayer dielectric in different manufacturing stages.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

It should be noted that throughout this application "%" means "volume %" unless otherwise specified. Further, the volume concentrations are given for the respective process gases under standard conditions and are thus directly related to a flow of the respective process gas under standard conditions, expressed in standard cubic centimeters per minute (sccm). Hence, e.g., a nitrogen content relates to the content of the undissociated nitrogen ($N_2$). Further, when reference is made to an etching process using a process gas, it is to be understood that "process gas" is not the process gas under standard conditions, but rather a plasma generated from the respective etching process the gas is used for and is suitable for etching. Within this description and the claims, the expression "to take a value" includes "manually adjusting the respective quantity so as to take the value," "automatically adjusting the respective quantity so as to take the value, e.g. by means of a appropriate control unit," "maintaining the respective quantity at the value," etc.

Figure 6:
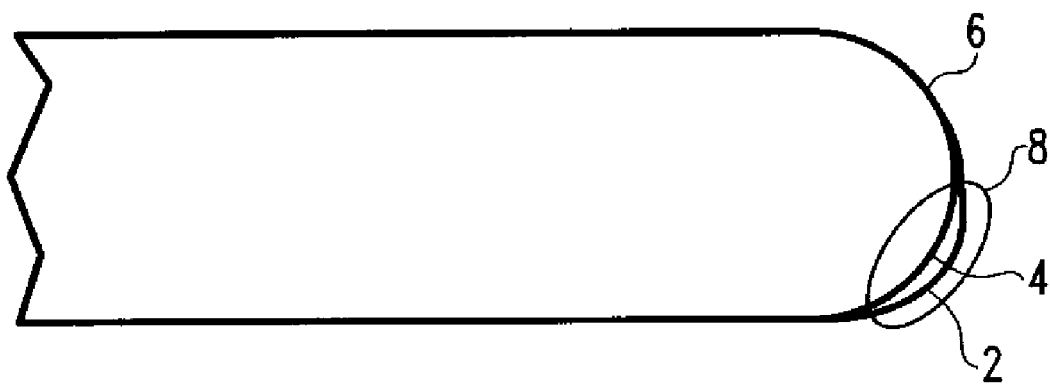
FIG. 6 schematically illustrates, in part, a cross-sectional view of a wafer with a polymer deposited at a backside bevel of the wafer due to a conventional etch process.

FIG. 6 shows a scenario which is obtained by using a conventional plasma etch process for etching an interlayer dielectric. A standard etch process turns out to leave silicon-containing polymers 2 on a backside bevel 4 of a wafer 6 that cannot be removed by the conventional in situ resist strip. In conjunction with a standard barrier/seed metal deposition tool, the backside polymer 2 can lead to severe flaking in a region at the backside bevel indicated at 8. The flaking reduces the yield.

Figure 7:
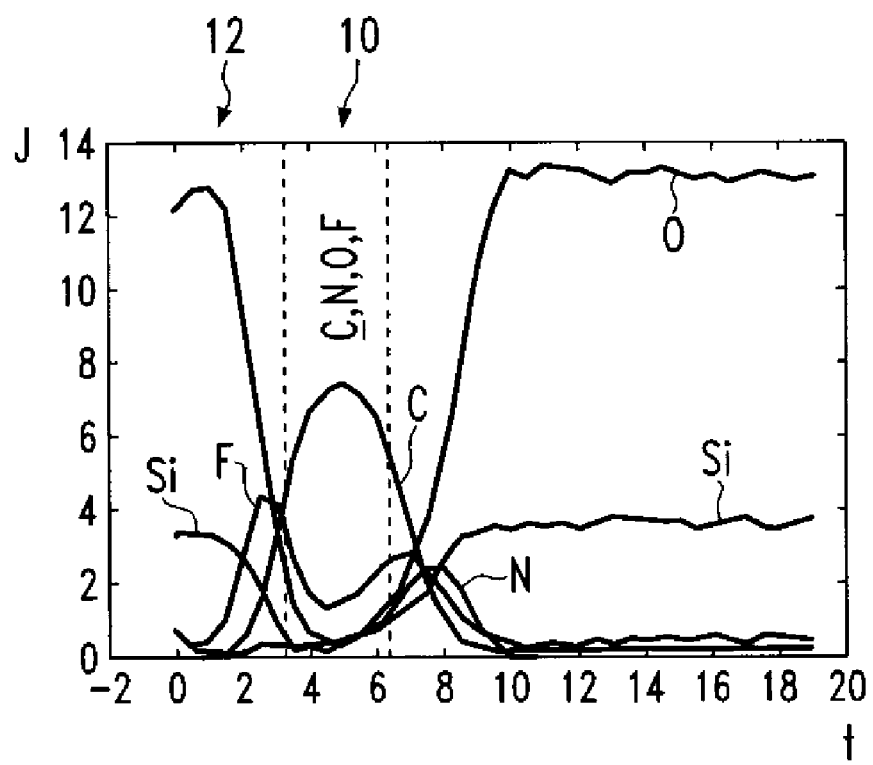
FIG. 7 illustrates an AES depth profile at the backside bevel of the wafer in FIG. 6.

The backside bevel 4 and the above formed polymer 2 have been examined by Auger Electron Spectroscopy (AES). AES is a standard method for surface analysis. For AES, atoms are excited by an electron beam which removes electrons from inner shells of the atoms. The resulting free electron states are filled with electrons from outer shells, wherein the resultant energy is transferred to another electron called Auger electron which leaves the atom. AES uses low energy Auger electrons in a range between approximately 20-2000 electron volts (eV). For Auger electrons in this energy range, the escape depth lies between approximately 0.5-2.0 nm, i.e., AES is highly surface sensitive. By repeated surface removal by ion bombardment (sputtering) of the investigated surface and subsequent AES, a depth profile of the composition near the surface of a specimen may be generated. Such a depth profile for the backside bevel 4 is shown in FIG. 7, where the intensity is plotted versus the sputter time t, i.e., versus depth. In FIG. 7, the intensity J and the sputter time t are given in arbitrary units.

FIG. 7 shows the depth profile of concentration of several elements, i.e., oxygen (O), nitrogen (N), fluorine (F), carbon (C) and silicon (Si), after a conventional plasma etch process of a dielectric layer in a capacitively coupled plasma etcher. It turns out that after etching the dielectric layer, a fluorocarbon ($CF_x$) polymer 2 has been formed at the backside wafer bevel 4, indicated at 10, between the dotted lines in FIG. 6. Above the polymer 2, a silicon-rich mixing layer has been formed, indicated at 12. This silicon-rich mixing layer is possibly the reason why the polymer 2 cannot be removed by extension of a post-etch treatment (PET) step after the conventional in situ resist strip.

To overcome this problem, the present disclosure presents a technique of etching a interlayer dielectric that may increase the yield of semiconductor devices by modifying the dielectric etch process so as to avoid the formation of polymers at a backside bevel 4 of a wafer 6 or by modifying the dielectric etch process so as to modify the polymer deposited on the backside bevel 4 of the wafer 6 such that it can stripped in situ. According to one illustrative embodiment, both aspects are achieved in that the formation of the polymer at the backside bevel 4 of the wafer 6 is substantially reduced and any remaining polymer can be stripped with a post-etch treatment (PET) as proposed hereinafter.

In the following, illustrative embodiments are described with regard to a typical process sequence for forming a via hole in a dielectric layer. For this purpose, reference is made to FIGS. 1A-1F.

FIG. 1A schematically illustrates a layer stack 100 in an exemplary manufacturing stage of a semiconductor device. In FIG. 1A, a lower dielectric layer 102 is provided having a wiring 104 of an electrical interconnection embedded therein. The surface 106 of the lower dielectric layer 102 and the conductive wiring 104 has been planarized, e.g., by chemical mechanical polishing (CMP). An etch stop layer 108 is provided over the surface 106. The etch stop layer 108 may be formed of, e.g., silicon nitride of any appropriate composition, e.g., $Si_xN_y$. An upper dielectric layer 110 is provided over the etch stop layer 108. The dielectric layer 110 may be any dielectric layer in a semiconductor device. For instance, the dielectric layer 110 may be a formed during a front end of the line process sequence or during a back end of the line process sequence. According to one embodiment, the dielectric layer 110 is an interlayer dielectric layer (ILD layer). Further, etching the dielectric layer 110 may correspond to any manufacturing stage in semiconductor device manufacturing. The upper dielectric layer 110 is the subject of the below-described processes and is therefore denoted only as "the dielectric layer" in the following. The dielectric layer 110 may be formed from a variety of materials, e.g., silicon dioxide ($SiO_2$), fluorine-doped silicon oxide, F-TEOS, etc. It should be understood that the etching of a via hole is only exemplary. Using the same processes, any trenches, recesses or the like may be etched in the dielectric layer 110, e.g., for providing a wiring of an electrical interconnection in a damascene process or a dual damascene process. That is, by using the below-described processes, a trench similar to the trench 112 for receiving the material of the wiring 104 in the lower dielectric layer 102 of FIG. 1A may be formed in the dielectric layer 110.

Above the dielectric layer 110, a masking layer 114, e.g., a polymer layer or a photo-resist layer, is provided which defines the position and the lateral extension of a via hole to be etched in the dielectric layer 110. To this end, the masking layer 114 is patterned to provide an opening 116 in the masking layer 114. The opening 116 may be formed by any appropriate method, e.g., lithography processes well known in the art. The bottom of the opening 116 may be covered with residual material 118 from previous processes.

According to one embodiment, prior to a main etch process of etching the dielectric material 110, a break-through etch process 120 is performed with a plasma on the basis of break-through process gas in order to remove the residual material 118 from the bottom of the opening 116 to thereby provide free access to the dielectric material 110. The break-through process gas may be comprised of a variety of gases depending upon the particular application, e.g., fluorocarbon, etc. According to one illustrative embodiment, the fluorocarbon includes tetrafluoromethane ($CF_4$) and trifluoromethan (CHF$_3$). According to another embodiment, a ratio of a volume concentration of the tetrafluoromethane (CF$_4$) to a volume concentration of the trifluoromethane (CHF$_3$) takes a value in the range from approximately 0.8:1 to 1.2:1. According to another embodiment, the break-through process gas is substantially free of nitrogen. According to another embodiment, the break-through process gas consists of tetrafluoromethane (CF$_4$) and trifluoromethan (CHF$_3$). In the illustrated embodiment, the break-through process gas consists of tetrafluoromethane (CF$_4$) and trifluoromethane (CHF$_3$) in equal volume concentration. According to another embodiment, the total flow rate through the plasma chamber during the break-through etch process 120 may take a value in the range between approximately 32-48 sccm. According to another embodiment, the flow rate may take a value in the range between approximately 36-44 sccm.

The layer stack 100 shown in FIG. 1A-1F is formed on a substrate, i.e., a wafer, of a diameter of 200 mm. Within this description, any flow rate may be scaled with the area of the wafer and hence with the diameter of the wafer. For example, the flow rate may be scaled proportional to the a wafer area, i.e., for a wafer of double diameter, a four-fold flow rate of the respective process gases may be supplied to the plasma chamber. In other embodiments, other scaling laws may be applied. In still other embodiments, process gases are supplied at a flow rate independent of the wafer size.

According to one embodiment, the total pressure of the break-through process gas takes a value in the range of approximately 80-120 mTorr. According to another embodiment, the total pressure of the break-through process gas takes a value in the range of approximately 9-110 mTorr.

According to one embodiment, during the break-through etch process 120, a ratio of a bias power per wafer area unit to a source power per wafer area unit takes a value in the range of approximately 3.2:1 to approximately 4.8:1. According to another embodiment, during the break-through etch process, a ratio of a bias power per wafer area unit to a source power per wafer area unit takes a value in the range of approximately 3.6:1 to approximately 4.4:1. According to one embodiment, during the break-through etching, a source power applied per wafer area unit takes a value in the range from approximately 5.1-7.6 kW/m$^2$. According to another embodiment, during the break-through etching, a source power applied per wafer area unit takes a value in the range from approximately 5.7-7.0 kW/m$^2$. In the illustrated embodiment, a source power applied per wafer area unit takes a value of approximately 6.4 kW/m$^2$. According to another embodiment, a bias power per wafer area unit takes a value in the range between approximately 20.4-30.56 kW/m$^2$. According to another embodiment, a bias power per wafer area unit takes a value in the range between approximately 22.9-28.0 kW/m$^2$.

According to one illustrative embodiment, the process time for the break-through etch process 120 takes a value in the range between approximately 29-43 seconds. According to another embodiment, the process time for the break-through etch process 120 takes a value in the range between approximately 32-40 seconds.

Figure 1B:
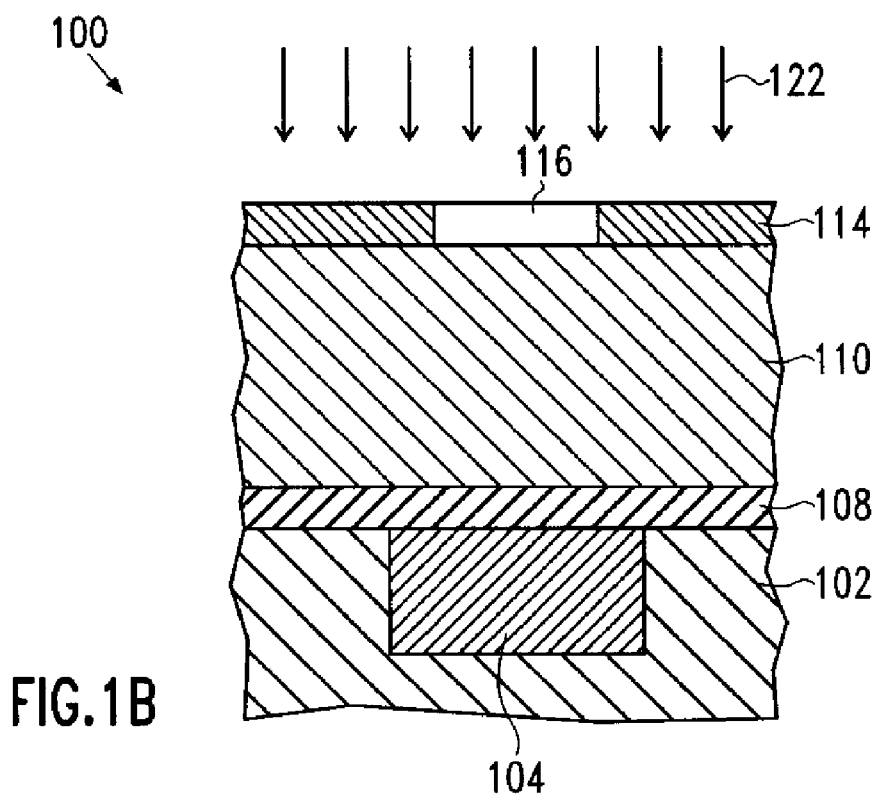

After removal of the residual materials 118, the layer stack 100 in the manufacturing stage as depicted in FIG. 1B is obtained. Thereafter, a dielectric etch process 122 is performed which includes providing a plasma on the basis of a nitrogen-containing dielectric etching process gas and etching the dielectric layer 110 with this plasma. According to one embodiment, the dielectric etch process 122 is a main etch process which may be flanked by additional etch processes like the above-described break-through etch process 120 or other processes, e.g., the processes disclosed hereinafter. In the dielectric etch process 122, due to the nitrogen-containing plasma, silicon nitride 121 is formed at the backside bevel 4 (FIG. 6) of the wafer 6 (FIG. 6) as illustrated in FIG. 5. The formation of silicon nitride 121 at the backside bevel 4 (FIG. 6) of the wafer 6 (FIG. 6) competes with the formation of polymers 2 (FIG. 6) and thereby at least reduces the formation of polymers 2 (FIG. 6) at the backside bevel 4 (FIG. 6). Further, silicon nitride is very stable and hence has no tendency to flaking. Further, polymers 2 (FIG. 6) formed on silicon nitride 121 can be readily removed in situ with a post-etch treatment (PET).

According to one illustrative embodiment, the dielectric etching process 122 employs a gas that comprises fluorocarbon. For example, the ratio of a volume concentration of the fluorocarbon to the volume concentration of nitrogen (N$_2$) takes a value in the range between approximately 0.24:1 and approximately 0.36:1. According to another illustrative embodiment, the ratio of a volume concentration of the fluorocarbon to the volume concentration of the nitrogen (N$_2$) takes a value in the range between approximately 0.27:1 and approximately 0.33:1. According to one embodiment, an absolute volume concentration of nitrogen (N$_2$) takes a value in the range between approximately 6-9%. According to another embodiment, the absolute volume concentration of nitrogen (N$_2$) takes a value in the range between approximately 6.7-8.2%.

According to another example, an absolute volume concentration of fluorocarbon takes a value in the range between approximately 1.8-2.7%. According to still another embodiment, the absolute volume concentration of fluorocarbon takes a value in the range between approximately 2.0-2.5%. According to one embodiment, the fluorocarbon includes octafluorobutane (C$_4$F$_8$). According to another embodiment, the fluorocarbon consists of octafluorobutane (C$_4$F$_8$), i.e., the octafluorobutane (C$_4$F$_8$) may be the only fluorocarbon component in the dielectric etching process gas.

The process gas employed during the dielectric etching process 122 may further contain oxygen (O$_2$). According to one embodiment, a ratio of a volume concentration of the oxygen (O$_2$) to a volume concentration of the nitrogen (N$_2$) takes a value in the range between approximately 0.08:1 and approximately 0.12:1. According to another embodiment, a ratio of a volume concentration of the oxygen to a volume concentration of the nitrogen takes a value in the range between approximately 0.09:1 and approximately 0.11:1. According to one embodiment, an absolute volume concentration of oxygen (O$_2$) takes a value in the range between approximately 0.6-0.9%. According to another embodiment, an absolute volume concentration of oxygen (O$_2$) takes a value in the range between approximately 0.68-0.83%. According to other embodiments, a flow rate between approximately 4-6 sccm oxygen (O$_2$), or, according to still other embodiments, between approximately 4.5-5.5 sccm oxygen (O$_2$) may be employed. The flow rates of the other components of the process gas used during the dielectric etching process 122 may be adapted accordingly to achieve the respective desired volume concentrations.

According to a further embodiment, the process gas used during the dielectric etching process 122 further contains argon (Ar). Other embodiments contain other noble gases. According to one embodiment, a ratio of a volume concentration of the argon (Ar) to a volume concentration of the nitrogen (N$_2$) takes a value in the range between approximately 9.6:1 and approximately 14.4:1. According to other embodiments, the ratio of a volume concentration of the argon (Ar) to a volume concentration of the nitrogen (N$_2$) takes a value in the range between approximately 10.8:1 and approximately 13.2:1. According to one embodiment, an absolute volume concentration of argon (Ar) takes a value in the range between approximately 72-96%. According to another embodiment, an absolute volume concentration of argon (Ar) takes a value in the range between approximately 81-93%.

According a further embodiment, the process gas used during the dielectric etching process 122 consists of fluorocarbon, e.g., octafluorobutane ($C_4F_8$), nitrogen ($N_2$), oxygen ($O_2$) and argon (Ar). Herein, the concentrations of these components may take values as illustrated above. According to one embodiment, the total flow rate through the plasma chamber during the dielectric etch process 122 may take a value in the range between approximately 536-804 sccm. According to another embodiment, the flow rate may take a value in the range between approximately 603-737 sccm.

According to one embodiment, a total pressure of the process gas used during the dielectric etching process 122 takes a value in the range of approximately 12-18 mTorr. According to other embodiments, the total pressure of the process gas used during the dielectric etching process 122 takes a value in the range of approximately 13.5-16.5 mTorr.

According to a further embodiment, during the dielectric etch process 122, a ratio of a bias power per wafer area unit to a source power per wafer area unit takes a value in the range of approximately 1.6:1 to approximately 2.4:1. According to another embodiment, a ratio of a bias power per wafer area unit to a source power per wafer area unit takes a value in the range of approximately 1.8:1 to approximately 2.2:1. According to another embodiment, a source power applied per wafer area unit takes a value in the range from approximately 12.7-19.1 kW/m$^2$ during the dielectric etch process 122. According to yet another embodiment, a source power applied per wafer area unit takes a value in the range from approximately 14.3-17.5 kW/m$^2$ during the dielectric etch process 122. According to another embodiment, a bias power applied per wafer area unit takes a value in the range from approximately 25.5-38.2 kW/m$^2$ during the dielectric etch process 122. According to another embodiment, a bias power applied per wafer area unit takes a value in the range from approximately 28.7-35.0 kW/m$^2$ during the dielectric etch process 122.

The etching time for the dielectric etching process 122 depends on the employed process parameters and on the thickness of the dielectric layer 110. According to one embodiment, the etching time for the main etch of the dielectric layer 110 with the plasma generated from the dielectric etching process gas ranges from approximately 88-132 seconds. According to another embodiment, the etching time for the main etch ranges from approximately 99-121 seconds.

Figure 1C:
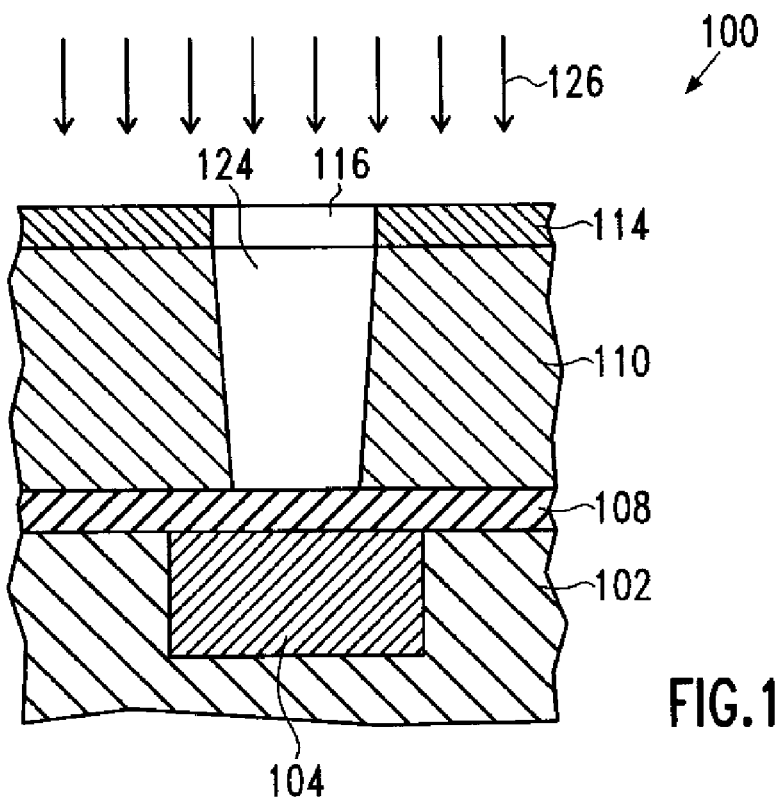

FIG. 1C shows the layer stack 100 of FIG. 1B after the dielectric etching process 122 is completed. A via hole 124 has been etched in the dielectric layer 110. According to the illustrative embodiment, the dielectric etching process 122 selectively etches the dielectric layer 110, i.e., the dielectric etch process 122 stops at the etch stop layer 108.

In accordance with one embodiment, the method illustrated in FIGS. 1A-1G comprises performing an etching process 126 to etch the etch stop layer 108, as illustrated in FIG. 1C. To this end, a plasma is generated in the etching process 126 and the etch stop layer 108 is etched with this plasma. According to one embodiment, process gas for the etching process 126 comprises fluorocarbon. According to one embodiment, the concentration of fluorocarbon takes a value in the range between approximately 18.5-27.7%. According to another embodiment, the concentration of fluorocarbon takes a value in the range between approximately 20.8-25.4%. According to a further embodiment, the fluorocarbon comprises tetrafluoromethane ($CF_4$).

According to one embodiment, process gas used during the etching process 126 comprises oxygen ($O_2$). According to one embodiment, the concentration of oxygen ($O_2$) in the process gas used during the etching process 126 takes a value in the range between approximately 6.2-9.2%. According to another embodiment, the concentration of oxygen ($O_2$) in the process gas used during the etching process 126 takes a value in the range between approximately 6.9-8.5%.

The process gas used during the etching process 126 may also comprise nitrogen. According to one embodiment, the concentration of nitrogen ($N_2$) in the process gas used during the etching process 126 takes a value in the range between approximately 55.4-83.1%. According to another embodiment, the volume concentration of nitrogen ($N_2$) in the process gas used during the etching process 126 takes a value in the range between approximately 62.3-76.2%.

According to one embodiment, during the etch stop layer etch process 126, only a bias power is applied and a source power is set to zero. In these situations, a bias power applied per wafer area unit of the wafer takes a value in the range from approximately 3.8-5.7 kW/m$^2$ during the etch stop layer etch process 126. According to another embodiment, a source power applied per wafer area unit takes a value in the range from approximately 4.3-5.3 kW/m$^2$.

The total pressure of the process gas used during the etching process 126 takes a value in the range of approximately 24-36 mTorr. According to other embodiments, the total pressure of the process gas used during the etching process 126 takes a value in the range of approximately 27-33 mTorr.

The process gas used during the etching process 126 may also comprise nitrogen ($N_2$), oxygen ($O_2$) and fluorocarbon, e.g., tetrafluoromethane ($CF_4$), each of these components in a concentration range as disclosed above. According to another embodiment, the total flow rate through the plasma chamber during the etch stop layer etching process 126 may take a value in the range between approximately 104-156 sccm. According to another embodiment, the flow rate may take a value in the range between approximately 117-143 sccm.

According to one embodiment, the etching time for the etch stop layer etching process 126 takes a value between approximately 32-48 seconds. According to another embodiment, the etching time for the etch stop layer etching process 126 takes a value between approximately 36-44 seconds.

Figure 1D:
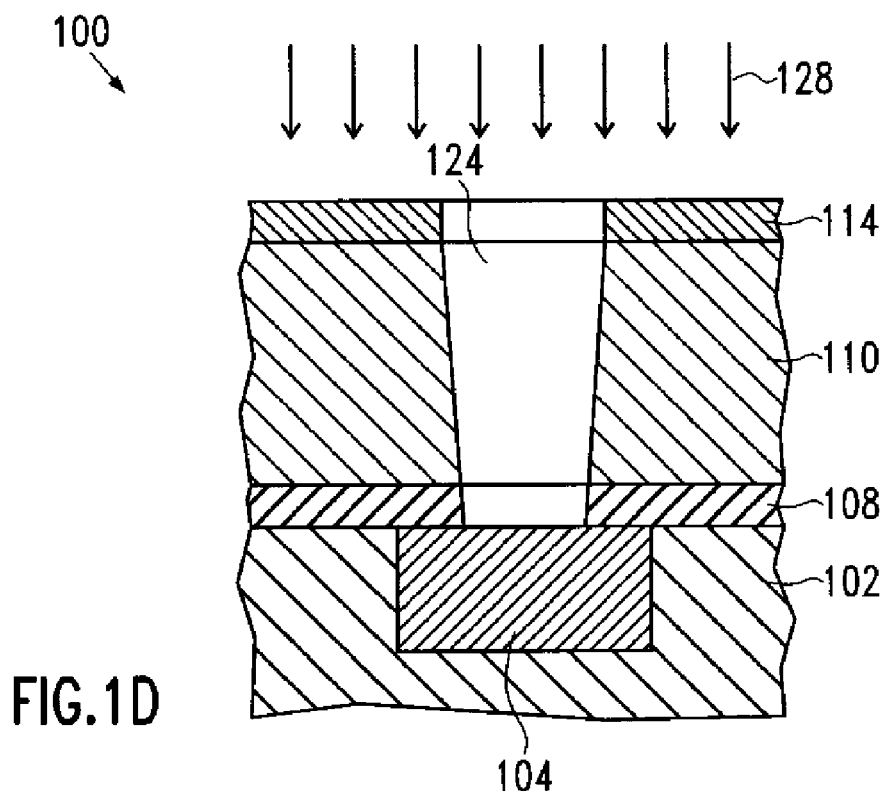

FIG. 1D shows the layer stack 100 after completing the etch stop layer etching process 126. Herein, the via hole 124 extends down to the conductive wiring 104, through the etch stop layer 108. In accordance with another embodiment, the method further comprises a resist oxidation process 128, e.g., an ashing process, as illustrated in FIG. 1D. The resist oxidation process 128 comprises generating a plasma from an oxygen-containing resist oxidation process gas and applying this plasma to the resist 114. For example, the resist oxidation process gas may consist of oxygen ($O_2$), i.e., the resist oxidation process gas may be a pure oxygen gas. According to the embodiment illustrated in FIGS. 1A-1G, the flow rate of oxygen ($O_2$) in standard cubic centimeters per minute (sccm) per wafer area unit of the wafer takes a value in the range between approximately 25.4-38.2 ksccm/m$^2$ (1 ksccm =1000 sccm). According to another embodiment, the flow rate of oxygen ($O_2$) per wafer area unit of the wafer takes a value in the range between approximately 28.6-35.0 ksccm/m$^2$. According to other embodiments, the values of flow rates obtained for a 200 mm wafer may be applied to wafers of other size without scaling.

During the resist oxidation process 128, according to one embodiment, a pressure in the chamber takes a value in the range between approximately 240-360 mTorr. According to another embodiment, the pressure in the chamber takes a value in the range between approximately 270-330 mTorr.

According to one embodiment, during the resist oxidation process, a bias power per wafer area unit of the wafer is selected to take a value in the range between approximately 5.09-7.64 kW/m$^2$. According to another embodiment, during the resist oxidation process, a bias power per wafer area unit of the wafer is selected to take a value in the range between approximately 5.73-7.00 kW/m$^2$.

According to one embodiment, during the resist oxidation process, a source power per wafer area unit of the wafer is selected to take a value in the range between approximately 38.2-57.3 kW/m$^2$. According to another embodiment, during the resist oxidation process 128, a source power per wafer area unit of the wafer is selected to take a value in the range between approximately 43.0-52.5 kW/m$^2$.

Figure 1E:
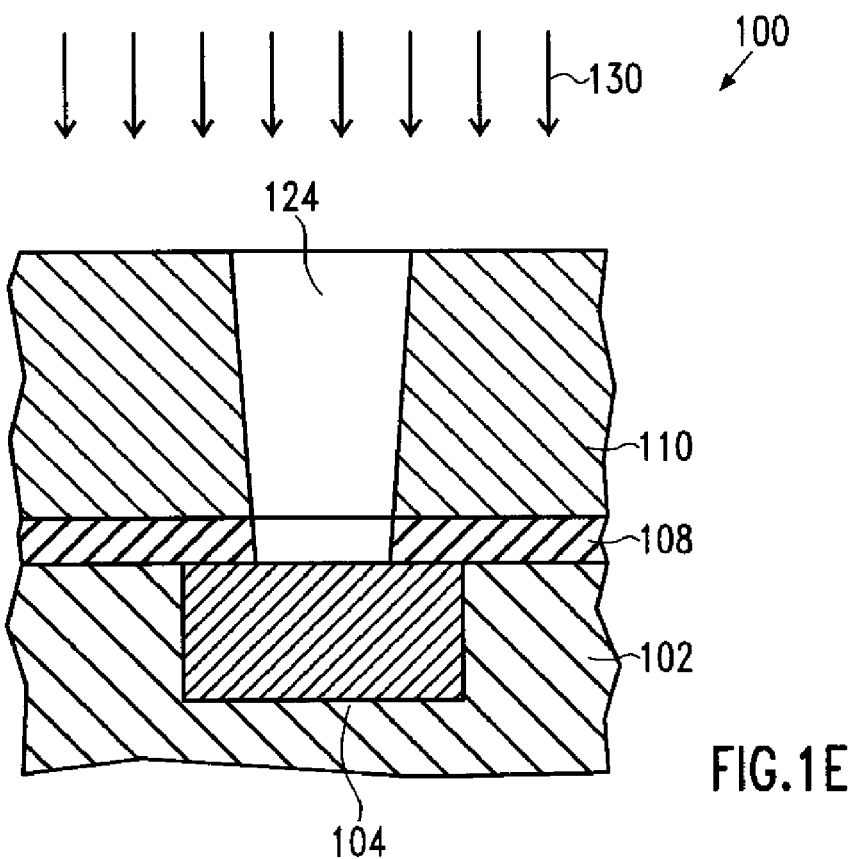

FIG. 1E shows the layer stack 100 after completing the resist oxidation process 128, i.e., after removal of the resist layer 114. According to one embodiment, a method comprises a post-etch treatment (PET) or post-etch process 130 as illustrated in FIG. 1E. The post-etch process 130 comprises generating a plasma from a post-etch process gas and applying this plasma to the semiconductor device. Since the main etch of the dielectric layer 110 has been performed with the main etch process gas having the composition according to one embodiment of the invention, only little or no polymer 2 (FIG. 6) is formed on the backside bevel 4 (FIG. 6) of the wafer 6 (FIG. 6). However, any residual polymer 2 (FIG. 6) on the backside bevel 4 (FIG. 6) of the wafer 6 (FIG. 6) can be removed by the post-etch treatment 130 described hereinafter. It should be noted that this post-etch treatment 130 also removes any residual polymer 2 (FIG. 6) from the via 124.

According to one embodiment, the process gas used during the post-etch treatment 130 comprises oxygen. According to one embodiment, the concentration of oxygen ($O_2$) in the post-etch process gas takes a value in the range between approximately 53.3-80%. According to another embodiment, the concentration of oxygen ($O_2$) in the post-etch process gas takes a value in the range between approximately 60.0-73.3%.

According to one embodiment, the process gas used during the post-etch treatment 130 comprises ammonia ($NH_3$). According to one embodiment, the concentration of ammonia ($NH_3$) in the process gas used during the post-etch treatment 130 takes a value in the range between approximately 26.7-40.0%. According to another embodiment, the volume concentration of ammonia ($NH_3$) in the process gas used during the post-etch treatment 130 takes a value in the range between approximately 30.0-36.7%. According to one illustrative embodiment, the process gas used during the post-etch treatment 130 consists of oxygen ($O_2$) and ammonia ($NH_3$), wherein the respective volume concentrations take values as disclosed above.

According to one embodiment, during the post-etch process 130, a ratio of a bias power per wafer area unit to a source power per wafer area unit takes a value in the range of approximately 0.11:1 to approximately 0.16:1. According to another embodiment, a ratio of a bias power per wafer area unit to a source power per wafer area unit takes a value in the range of approximately 0.12:1 to approximately 0.15:1. According to one embodiment, a source power applied per wafer area unit takes a value in the range from approximately 38.2-57.3 kW/m$^2$ during the post-etch treatment 130. According to another embodiment, a source power applied per wafer area unit takes a value in the range from approximately 43.0-52.5 kW/m$^2$ during the post-etch treatment 130. According to one embodiment, a bias power applied per wafer area unit takes a value in the range from approximately 5.09-7.64 kW/m$^2$ during the post-etch process 130. According to another embodiment, a bias power applied per wafer area unit takes a value in the range from approximately 5.73-7.00 kW/m$^2$ during the post-etch process 130.

According to one embodiment, a total pressure of the process gas used during the post-etch treatment 130 takes a value in the range of approximately 24-36 mTorr. According to other embodiments, the total pressure of the process gas used during the post-etch treatment 130 takes a value in the range of approximately 27-33 mTorr.

According to one embodiment, the process gas used during the post-etch treatment 130 comprises oxygen ($O_2$) and ammonia ($NH_3$), each of these components in a concentration range as disclosed above. According to one embodiment, the total flow rate through the plasma chamber during the post-etch process 130 may take a value in the range between approximately 180-270 sccm. According to another embodiment, the flow rate may take a value in the range between approximately 203-248 sccm.

According to one embodiment, the etching time for the post-etch process 130 takes a value between approximately 24-36 seconds. According to another embodiment, the etching time for the post-etch process 130 takes a value between approximately 27-33 seconds.

The above illustrated total flow rates and power specifications may be employed in an exemplary embodiment of a 200 mm wafer. However, these values may be used unchanged for other wafer sizes or may be scaled appropriately to obtain similar results. For instance, at least one of the total flow rate, the source power or the bias power may be linearly scaled with the surface area of the wafer used. Further, it should be understood that the above processes may be varied in their sequence. For example, the resist oxidation process 128 may be carried out prior to the etch stop layer etching process 126. Further, additional processes may be carried out or only part of the above processes may be carried out.

According to one embodiment, at least the main etch process 122 is carried out with a cathode temperature between approximately 40-60° C. According to another embodiment, at least the main etch process 122 is carried out with a cathode temperature between approximately 45-55° C. According to other embodiments, the respective cathode temperature during the main etch process 122 is also applied during at least one of or during each of the break-through etch process 120, the etch stop layer etching process 126, the resist oxidation process 128 and the post-etch process 130.

Figure 1F:
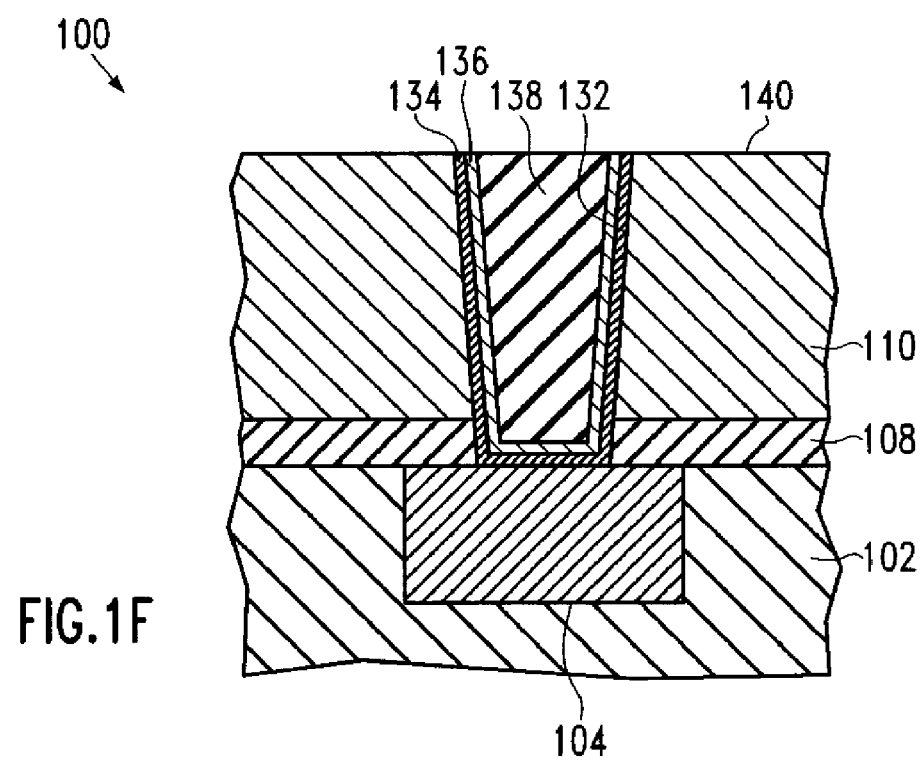
Figure 4:
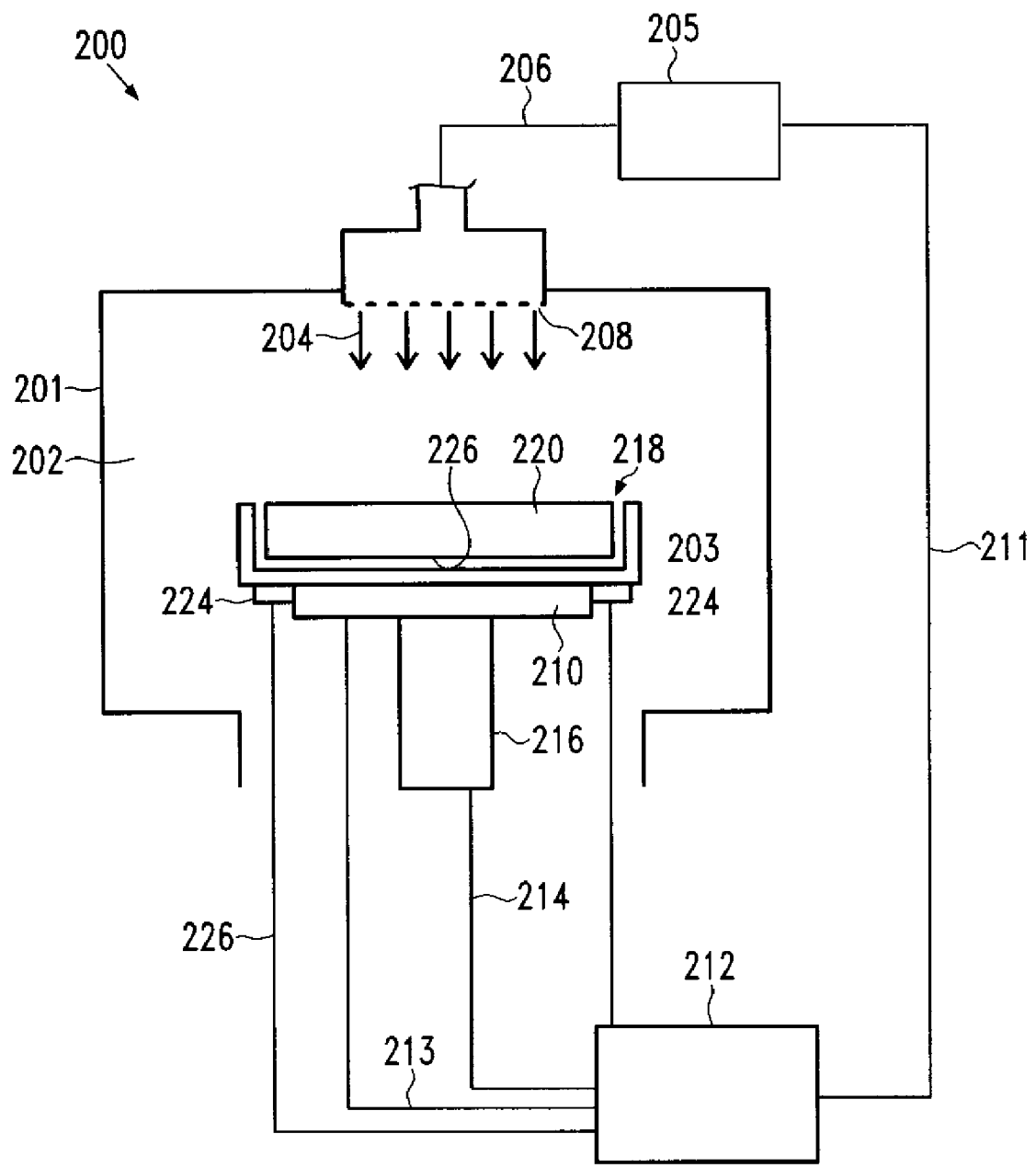
FIG. 4 schematically illustrates another embodiment of a plasma etching device.

After performing the post-etch treatment, the via hole 124 can be filled with a conductive material according to processes well known in the art. According to one embodiment, the conductive material forms a metal plug, an exemplary embodiment of which is shown in FIG. 1F. A barrier layer 134, e.g., of tantalum (Ta) or tantalum nitride (TaN), is formed on a surface 132 of the via hole 124. A seed layer 136, e.g., a copper seed layer, is formed on the barrier layer 134. The barrier layer 134 and the seed layer 136 may be formed by any appropriate method, e.g., by chemical vapor deposition (CVD) or physical vapor deposition (PVD) or sputtering. Further conductive material 138, e.g., copper, is formed on the seed layer 136. For instance, the space defined by the copper seed layer may be filled with copper 138, e.g., by electroplating or electroless plating. In FIG. 4, the upper surface has already been planarized after plating, e.g., by chemical mechanical polishing.

Figure 2A:
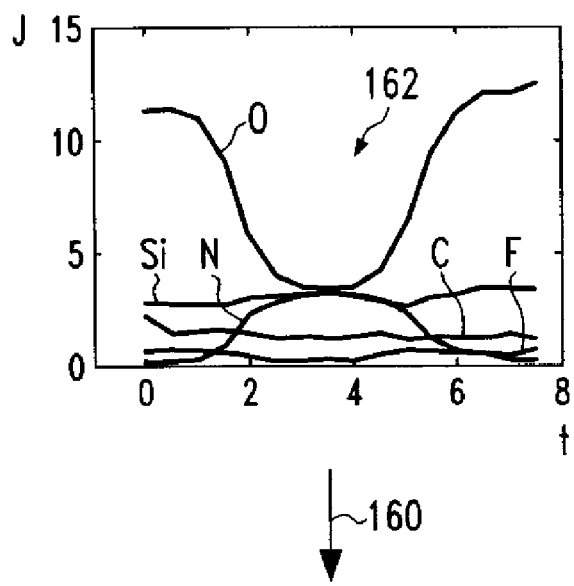
FIGS. 2A-2C illustrate AES depth profiles of a backside of a wafer at and close to a wafer bevel.
Figure 2B:
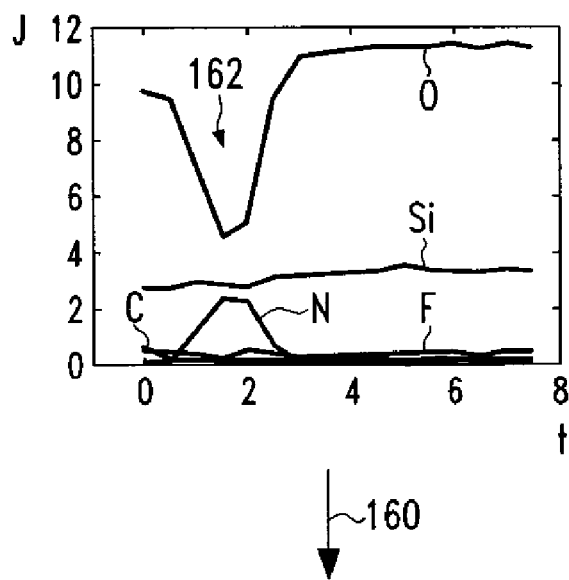
Figure 2C:
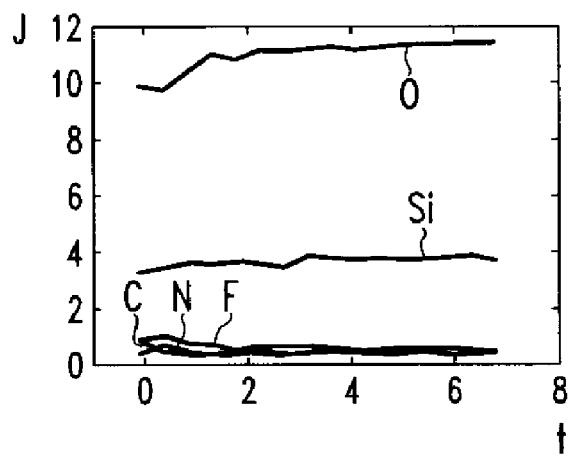

In the conventional systems, i.e., by using conventional etching techniques, the flaking at the backside wafer bevel 4 (FIG. 6) occurs in particular after the barrier layer/seed layer deposition. In contrast hereto, by using the methods or embodiments disclosed herein, the flaking is substantially reduced or completely avoided. FIGS. 2A-2C show Auger depth profiles at different positions at the backside wafer bevel 4 (FIG. 6) after performing the processes illustrated by FIGS. 1A-1F. FIGS. 2A-2C show the intensity of the Auger signal as a function of sputter time, i.e., as a function of depth. The intensity and the sputter time t are given in arbitrary units and are provided for qualitative analysis. From FIGS. 2A-2C, the measurement position where the Auger depth profiles have been taken is varied towards the center of the wafer. This change in measurement position is indicated by the arrows 160 between FIGS. 2A and 2B and FIGS. 2B and 2C, respectively. In the Auger depth profiles shown in FIGS. 2A-2C, no fluorocarbon polymers can be observed. Only silicon nitride, indicated at 162 in FIGS. 2A and 2B, can be observed at the backside bevel 4 (FIG. 6). That is, an embodiment of a method illustrated throughout FIGS. 1A-1E is capable of forming a via hole, or any other recess, in an interlayer dielectric without leaving any substantial concentration of polymers 2 (FIG. 6) at the backside wafer bevel 4 (FIG. 6).

Figure 3:
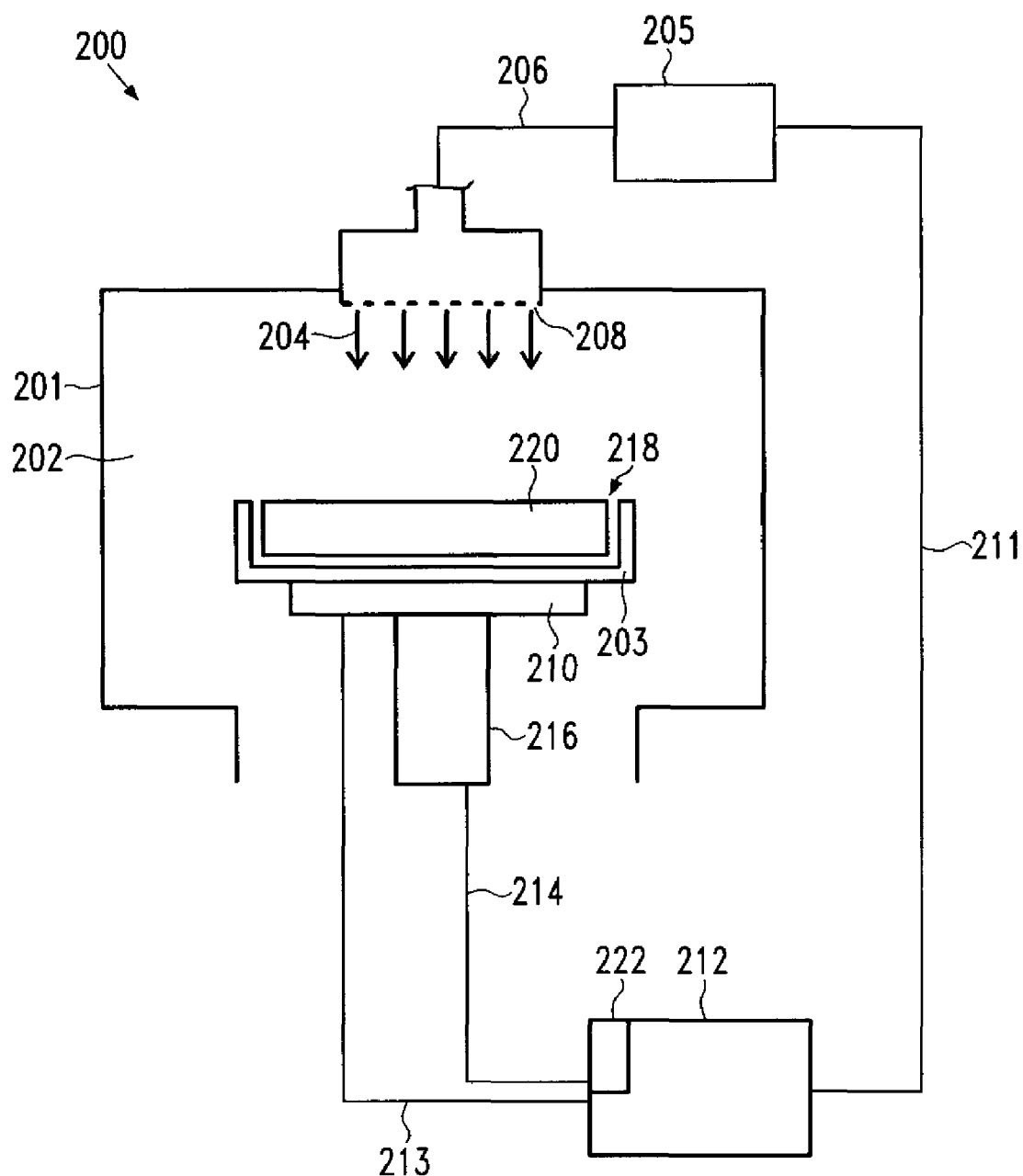
FIG. 3 schematically illustrates an embodiment of a plasma etching device.

FIG. 3 shows a plasma etching device 200 according to one illustrative embodiment. The exemplary plasma etching device 200 is a capacitively coupled plasma etching device, for example, a multi-frequency capacitively coupled plasma etcher. However, inductively coupled plasma etching devices may also be used in conjunction with the inventive method or embodiments thereof. A housing 201 comprises a plasma chamber 202 which contains a cathode 203 for generating a plasma from a process gas 204. The process gas is supplied to the chamber 202 from a gas supply 205 via a gas supply line 206 through a process gas outlet 208. The gas supply 205 is controlled via a gas supply control line 211 by a control unit 212. The cathode comprises a temperature conditioner 210 which is controlled by the control unit 212 via a temperature control line 213. The control unit 212 also controls a supply of electrical energy to the cathode 203 via an electrical supply line 214. The cathode 203 and the temperature conditioner may be part of a cathode assembly 216 which comprises a receiving space 218 for receiving a substrate 220 to be treated with the plasma etching device 200.

The control unit 212 is adapted to carry out the method according to the embodiments disclosed herein. According to one embodiment, the control unit 212 is adapted to control the gas supply 205. According to another embodiment, the control unit 212 is adapted to control a power supply 222 for providing a respective electrical energy, e.g., the source power and the bias power, to the cathode. According to another embodiment, the control unit 212 is adapted for controlling the temperature conditioner 210 to maintain a desired cathode temperature. The control unit 212 may comprise individual components for each of the control functions of the control unit 212. The individual components may be integrated in a single device or may be formed of individual devices. The individual components may be realized in hardware, or, if possible, in software.

To this end, the control unit 212 may comprise a processor, to which a computer program product is provided which enables the processor to carry out the method according to the embodiments disclosed herein.

FIG. 4 shows another embodiment of a plasma etching device 200 which differs from the plasma etching device 200 shown in FIG. 3 in that the plasma etching device 200 shown in FIG. 4 comprises a temperature conditioner 224 for individually conditioning a temperature at an outer circumferential region of the substrate receiving space. Thereby, temperature gradients over the wafer, and in particular temperature gradients at a bevel 4 (FIG. 6) of the wafer 6 (FIG. 6), can be minimized. The temperature conditioner 224 comprises a central conditioner portion and outer peripheral conditioner portions. The outer peripheral conditioner portions may be positioned facing a backside 226 of the wafer 220 to be treated with the plasma. The outer peripheral temperature conditioner portions are controlled by the control unit 212 via respective control lines. The temperature conditioner 224 is operated so as to eliminate a temperature gradient over the wafer, and in particular a temperature gradient at the bevel region of the wafer. In this way, the formation of polymers at the bevel is further reduced. The temperature conditioner 224 may comprise two or more individual conditioner portions. In other embodiments, the temperature conditioner 224 may be a single conditioner.

Temperature conditioners as discussed herein may comprise temperature sensors for providing a regulated temperature. Temperature conditioners as discussed herein may be operated by any appropriate method, e.g., by applying power to electrical heating elements, controlling the supply of a coolant to the temperature conditioner, etc. In this sense, the control lines 213, 226 to the temperature conditioners 210, 224 include coolant conduits as well as electrical wires.

The plasma etching devices illustrated herein may comprise coils (not shown) for generating a magnetic field suitable to control the plasma in the plasma chamber 202.

As a result, a method including a dielectric etch process is provided which avoids flaking of a polymer 2 (FIG. 6) deposited at a backside bevel 4 (FIG. 6) of a wafer 6 (FIG. 6) and problems associated therewith. Accordingly, by using the subject matter disclosed herein, the yield in semiconductor device manufacturing may be increased. The embodiments manage the backside polymer deposition during the etch process in two ways. First, backside polymer deposition is substantially avoided or reduced during all etch process steps. Second, backside polymer formed during an inventive etch process is removed, in situ, during the integrated resist strip. These items will be accomplished by the following parameter optimizations: (1) minimizing or eliminating temperature gradients within the process chamber so that no or less condensation of $C_xF_y$ fragments can happen; (2) increasing chamber/cathode temperature in order to shift the process chemistry so that less $C_xF_y$ fragments will be created; (3) increasing the source power leads to more fragmentation of the $C_xF_y$ process gas, so that less polymerization occurs; (4) reducing bias power results in less ion bombardment, hence the process shifts towards more chemical etching and there will be less ion bombardment/reflection at the wafer bevel; and (5) changing etch chemistry by adding a process gas, e.g., $N_2$, which either avoids the build-up of backside polymer or which modifies the deposited backside polymer in a way that can be stripped in situ.

An optimal combination of the mentioned process parameters above results in an interlayer dielectric etch process which meets the required target parameters like: via shapes; CD requirements; $CF_x$-polymer-free wafer bevels, which do not need an additional backside wet clean; enables flake-free, high yielding process.

According to one illustrative embodiment, the cathode temperature is maintained at approximately 50° C. Further, during a main etch process of an interlayer dielectric, nitrogen is added as a process gas. Further, a relatively high source power is used. Further, a relatively low bias power is used.

The principles disclosed herein can be used with a high degree of process compatibility with conventional approaches. It should be noted that, although in the illustrative embodiments specific fluorocarbon compounds have been disclosed, any appropriate carbon/fluorine compound or carbon/hydrogen/fluorine compound may be used instead of the disclosed specific examples.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of patterning a dielectric layer of a semiconductor device, the method comprising:
   providing a semiconductor device having a metallization layer and a dielectric layer adjacent said metallization layer;
   providing a mask layer on said dielectric layer, said mask layer defining unmasked regions of said dielectric layer;
   providing a plasma on the basis of a dielectric etching process gas, wherein said dielectric etching process gas comprises oxygen and nitrogen, and wherein a ratio of a volume concentration of said oxygen to a volume concentration of said nitrogen takes a value in the range between approximately 0.08:1 and 0.12:1; and
   etching said dielectric layer with said plasma in said unmasked regions, thereby patterning said dielectric layer.

2. The method of claim 1, wherein the total pressure of said dielectric etching process gas takes a value in the range of approximately 12-18 mTorr.

3. The method of claim 1, wherein a ratio of a bias power per wafer area unit to a source power per wafer area unit takes a value in the range of approximately 1.6:1 to 2.4:1.

4. The method according to claim 1, the method further comprising a etch stop layer etching process, the etch stop layer etching process comprising generating a plasma from an etch stop layer etching process gas, wherein the etch stop layer etching process gas comprises nitrogen, oxygen and fluorocarbon.

5. The method according to claim 1, the method further comprising a post-etch process, the post-etch process comprising generating a plasma from a post-etch process gas, wherein said post-etch process gas comprises oxygen and ammonia.

6. The method according to claim 1, wherein a cathode temperature is maintained at 50° C. during said etching of said dielectric layer with said plasma on the basis of said nitrogen-containing dielectric etching process gas.

7. The method of claim 1, wherein said dielectric etching process gas comprises fluorocarbon, and the ratio of a volume concentration of said fluorocarbon to the volume concentration of said nitrogen takes a value in the range between approximately 0.24:1 and 0.36:1.

8. The method of claim 2, wherein said at least one fluorocarbon component comprises octafluorobutane or consists of octafluorobutane.

9. The method of claim 1, wherein said dielectric etching process gas contains argon.

10. The method of claim 9, wherein a ratio of a volume concentration of said argon to a volume concentration of said nitrogen takes a value in the range between approximately 9.6:1 and 14:1.

11. The method of claim 1, wherein etching said dielectric layer with said plasma on the basis of said dielectric etching process gas is a main etch process, the method further comprising a break-through etch process with a plasma on the basis of break-through process gas prior to said main etch process, wherein said break-through process gas comprises of fluorocarbon.

12. The method of claim 11, wherein said fluorocarbon includes tetrafluoromethane ($CF_4$) and trifluoromethan ($CHF_3$).

13. The method of claim 11, wherein the total pressure of the said break-through process gas takes a value in the range of approximately 80-120 mTorr.

14. The method of claim 11, wherein, during said break-through process, a ratio of a bias power per wafer area unit to a source power per wafer area unit takes a value in the range of approximately 3.2:1 to 4.8:1.

15. A method of patterning a dielectric layer of a semiconductor device, the method comprising:
   providing a plasma chamber;
   providing a semiconductor device in said plasma chamber, said semiconductor device having a metallization layer and a dielectric layer adjacent said metallization layer;
   etching said dielectric layer with a plasma on the basis of a dielectric etching process gas, wherein said dielectric etching process gas comprises fluorocarbon, oxygen, and nitrogen, and wherein said nitrogen is provided in said plasma chamber at a flow rate between approximately 40-60 sccm, and wherein a ratio of a volume concentration of said oxygen to a volume concentration of said nitrogen takes a value in the range between approximately 0.08:1 and 0.12:1.

* * * * *